_United States Patent_ [19]

Henry et al.

[11] Patent Number: 4,481,631

[45] Date of Patent: Nov. 6, 1984

[54] LOSS STABILIZED BURIED HETEROSTRUCTURE LASER

[75] Inventors: Charles H. Henry, New Providence; Ralph A. Logan, Morristown, both of N.J.

[73] Assignee: AT&T Bell Laboratories, Murray Hill, N.J.

[21] Appl. No.: 273,109

[22] Filed: Jun. 12, 1981

[51] Int. Cl.³ .............................................. H01S 3/19
[52] U.S. Cl. ....................................... 372/45; 357/17; 372/46
[58] Field of Search ................ 372/44, 45, 46; 357/17

[56] References Cited

U.S. PATENT DOCUMENTS 4,121,177  10/1978  Tsukada ................................. 372/45

OTHER PUBLICATIONS

Casey et al., "GaAs–$Al_xGa_{1-x}As$ heterostructure laser with separate optical and carrier confinement", _J.A.P._ vol. 45, No. 1, Jan. 1974, pp. 322–333.

_Primary Examiner_—James W. Davie
_Attorney, Agent, or Firm_—Richard D. Lauman

[57] ABSTRACT

A buried heterostructure laser which obtains lowest mode operation by larger differences in loss between the lowest and higher order modes is described. The loss is achieved by interface scattering between the mesa and the burying layer. The scattering losses increase with refractive index discontinuity, interface roughness and decreasing mesa width. Stabilization results because scattering losses increase rapidly with the order of the transverse modes.

10 Claims, 3 Drawing Figures

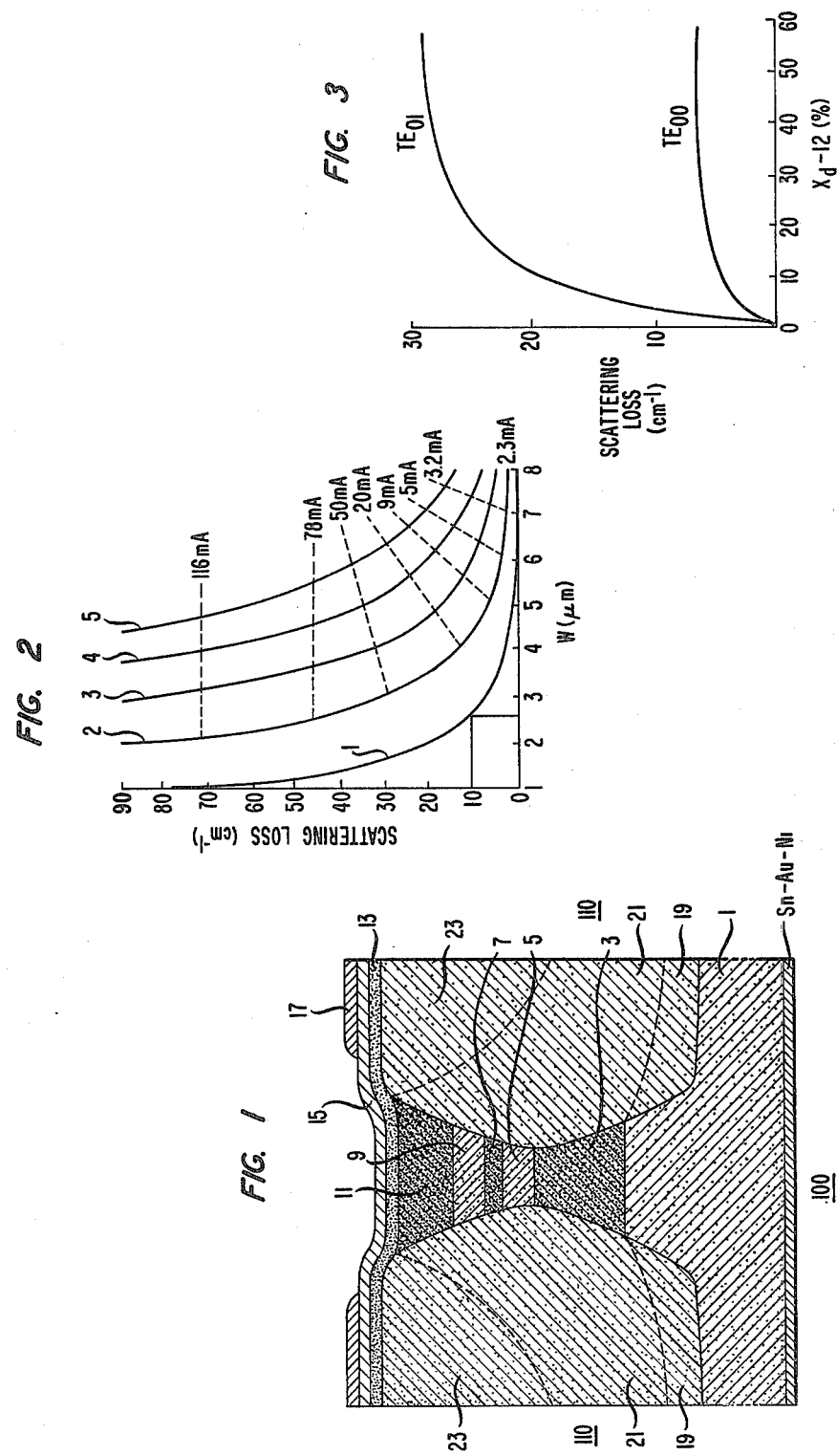

LOSS STABILIZED BURIED HETEROSTRUCTURE LASER

TECHNICAL FIELD

This invention relates generally to a semiconductor laser and particularly to a buried heterostructure laser.

BACKGROUND OF THE INVENTION

Optical communications systems presently contemplated use a light source and a photodetector that are optically coupled to each other by a glass transmission line which is commonly referred to as an optical fiber. Two types of devices, light emitting diodes and lasers, have received serious consideration as candidates for the light source. The laser is generally considered, especially at high data rates, to be the superior device.

Many semiconductor laser structures have been considered as candidates for the light source in such optical communications systems. At the present time, it is the consensus of those working in the art that buried heterostructure (BH) lasers are the leading candidates for optical communications systems because of their low current thresholds and stable operation up to high power. A BH laser is typically fabricated by growing a double heterostructure laser, etching a mesa, and cladding the sides of the mesa with semiconductor material grown during a second growth. The resulting laser is index guided with carriers confined to the active layer in both transverse directions. Such BH lasers have desirable characteristics such as a linear light versus current characteristic, stability against both kinks and pulsations in the absence of gross defects and no optical astigmatism.

An early article describing early work on BH lasers is Journal of Applied Physics, 45, pp. 4899–4906, Nov., 1974. This article describes an $Al_xGa_{1-x}As$-GaAs BH laser which achieved lowest mode operation. Such operation is desirable because it insures that the light emission pattern, and thus the coupling efficiency between the laser and optical fiber, will not change. This operation was obtained using a very narrow and thin, desirably less than 0.4 $\mu$m in both height and width, active region which was surrounded by material having a refractive index no more than 5 percent different from that of the active layer. This dimensional constraint makes it impractical to reliably construct the laser and also gives it a low power capability.

A later structure which is called a BH laser with buried optical guide (BOG) is described in Applied Physics Letters, 35, pp. 513–516, Oct. 1, 1979. This device uses a guiding layer adjacent to the active layer to widen the near field pattern perpendicular to the junction plane and thus increase the power that can be coupled into an optical film. The device can also use a stripe width as large as 4 $\mu$m. Such a dimension is obtained only if the burying layer has a refractive index very close to that of the guiding layer.

A BH laser that currently represents the state of the art is the buried optical guide (BOG) laser, which is illustratively described in IEEE Journal of Quantum Electronics, QE-16, pp. 205–214, Feb., 1980. This laser incorporates a passive optical waveguide that results in the laser having a high differential quantum efficiency, low far field spreading and high catastrophic optical damage limits. The BOG laser has achieved thresholds as low as 10 mA/$\mu$m of stripe width.

While perfectly adequate for many purposes, the BOG laser described suffers the drawback of involving critical fabrication steps. Although it is relatively simple to grow BH or BOG lasers with multimode waveguides because minimal constraints are imposed on the second or regrowth composition, it is difficult to make BH or BOG lasers with waveguides that are either single mode or with a gain of the fundamental transverse mode that is appreciably greater than any other mode without critical requirements being imposed on composition, dimensions, etc. In the BH and BOG lasers, the desired low mode operation is obtained by choosing the index of refraction of the second growth or outer cladding layer to be very slightly less than the effective index of the mesa layers. This imposes very critical limits on the composition of the regrowth layer. For example, for 2–3 $\mu$m wide BOG lasers, the x of $Al_xGa_{1-x}As$ regrowth or second growth layer must be approximately only 1 to 2 percent more than the effective value of x, ($x_{eff}$), for the mesa layers. Since $x_{eff}$ is a function of the dimensions and compositions of the layers of the central mesa, these layers must also be held to close tolerances. The percentage change in refractive index, n, is about 1/5 the percentage change in x, i.e., when n changes by 1 percent, x changes by 0.05 percent.

SUMMARY OF THE INVENTION

We have found that a single mode buried heterostructure laser may be made without any critical fabrication steps. The lack of critical fabrication steps and simplicity of growth results from not attempting to grow a single mode structure by careful control of dimensions and composition but from forming a multiple mode guide by growing a burying layer with a composition that produces a large refractive index discontinuity between the mesa and the burying layer. The index discontinuity and roughness of the mesa walls produce losses which increase rapidly with mode number and effectively result in lowest mode operation.

The structure comprises an active layer, first and second semiconductor layers on opposing sides of said active layer and a third semiconductor layer contacting opposite side faces of said active and first and second semiconductor layers. The third layer thus forms a burying layer for the mesa formed by the active and first and second semiconductor layers. The active layer has a bandgap less than the bandgaps of the first and second semiconductor layers and the third semiconductor layer has an index of refraction less than the effective index of the mesa layers by at least approximately 4 percent. The device may further comprise first and second guiding layers intermediate said active layer and said first semiconductor layer and said active layer and said second semiconductor layer, respectively, having opposite side faces contacting said third semiconductor layer. If desired, only a single guiding layer may be used.

In a preferred embodiment, the semiconductor layers comprise $Al_xGa_{1-x}As$ with x for the third semiconductor layer being at least 20 percent greater than the effective x for the mesa layers.

BRIEF DESCRIPTION OF THE DRAWING

FIG. 1 is a cross-section view of a loss stabilized buried heterostructure laser of this invention;

FIG. 2 plots the calculated interface scattering loss, vertically, versus the width, horizontally, of the mesa for a laser of this invention; and FIG. 3 plots the scattering loss, vertically, versus refractive index discontinuity, horizontally, for the two lowest modes for a laser of this invention.

DETAILED DESCRIPTION

FIG. 1 shows a device, indicated generally as 100, of this invention. The device comprises substrate 1 and disposed on said substrate: first cladding layer 3, first guiding layer 5, active layer 7, second guiding layer 9 and second cladding layer 11. The mesa formed by layers 3, 5, 7, 9 and 11 is embedded within the layer indicated generally as 110 which, as shown, contacts opposite side faces of layers 3, 5, 7, 9 and 11 as well as substrate 1. Layer 110 further comprises layer 19, layer 21 and layer 23. Disposed on layer 11 and layer 23 is a diffusion layer 13, and metal layers 15 and 17. Layer 25 is disposed on the surface of substrate 1 opposite layers 3 and 19. For reasons of clarity, the elements of the device are not drawn to scale. The active layer has a bandgap less than the bandgaps of layers 5 and 9 and there is a large discontinuity in the refractive index between the mesa layers and layer 110. The refractive index of layer 110 is generally at least 4 percent less than the effective refractive index of the mesa layers.

The refractive index discontinuity and fluctuations in mesa width causes losses which increase rapidly with increasing mode number and provide a selection mechanism for operation in the lowest mode. This is achieved without critical constraints on maximum active layer dimensions or burying layer composition that are difficult to satisfy in the fabrication of actual devices.

Substrate 1 and layers 3 and 5 have a first conductivity type and layers 9 and 11 have a second conductivity type so that a p-n junction is formed within the active layer. The active layer may have either conductivity type. Layer 21 has a second conductivity type and layers 19 and 23 have a first conductivity type. In a preferred embodiment, the first conductivity type is n-type and the second conductivity type is p-type.

The semiconductor materials may be selected from the group consisting of Group III-V elements. For example, $Al_xGa_{1-x}As$ or InGaAsP may be used. In one preferred embodiment, the semiconductor layers comprise $Al_xGa_{1-x}As$ with $x=0$ for substrate 1 and layer 7, 0.30 for layers 3 and 11, 0.15 for layers 5 and 9 and 0.65 for layers 19, 21 and 23. Layers 3 and 5 were n-type and layers 7, 9 and 11 were p-type. Layers 19 and 23 were n-type and layer 21 was p-type.

The lasers of this invention are conveniently fabricated by a modification of the well-known two-step liquid phase epitaxy process which will be described by reference to the fabrication of $Al_xGa_{1-x}As$ lasers. In the first step, the desired laser structure is grown and the total thickness of the epitaxial layers is typically approximately 4 $\mu$m. It is necessary to etch through the epitaxial layers into the substrate to form the mesas, and since the etchant used undercuts the photoresist mask at about the same rate as it etches into the layers, a 12 $\mu$m wide stripe mask was used to produce mesas with a 4 $\mu$m top width. The width of the mask is generally approximately 3 times the width of the etched mesa top. A suitable etchant is $H_2SO_4$:$H_2O_2$ (30 percent): $H_2O = 1:8:10$ at 24 degrees Celsius. The stripes were oriented along the <110> directions to produce narrow waisted mesas and the width of the mesa at the active layer is generally less than 3 $\mu$m for reasons which will be discussed later. The etching is conveniently monitored by observing the width of the mesa top through the transparent photoresist mask. For example, a Shipley 1350J photoresist mask may be used. This procedure easily produces the desired mesas etched into the substrate with some fluctuations in the widths of the mesa tops due to the extensive etching. After visual observations, it was estimated that the mesa top width generally changed slightly over distances of 10 $\mu$m and that the maximum change in width was typically about 0.3 $\mu$m while the root mean square amplitude of the fluctuations in the position of each mesa side wall interface, termed A in this application, was about 0.1 $\mu$m. The photoresist mask was removed in a commercial photoresist stripper and then, as a final cleaning step, a native oxide was grown on the sample surface. Prior to the regrowth step, the native oxide was removed by a short soak in equal parts of ammonium hydroxide and water.

An alternative to use of the roughening etch described employs a roughening mask, i.e., a stripe mask that has fluctuations in its width. The mesa etching may also proceed as follows. The upper cladding layer is first selectively removed over distances of approximately 100 $\mu$m, separated by distances of approximately 280 $\mu$m so that after regrowth and cleaning in the passive 100 $\mu$m region, lasers with mirrors in passive regions are formed. This is accomplished by masking to leave slits having dimensions of 5 $\mu$m and 100 $\mu$m exposed in the heterostructure surface through which the upper cladding is selectively etched down to the active layer. The surface is then cleaned, the stripe mask is superpositioned over the etched slits and the mesa etching is performed.

A convenient composition for cladding the mesas, i.e., forming layer 110, is $Al_{0.65}Ga_{0.35}As$ since it can provide excellent current confinement characteristics although any $Al_xGa_{1-x}As$ composition having an x value greater by at least approximately 20 percent than the effective x value of the mesa structure may be used. The excellent current confinement arises because it is very difficult to dope this concentration in liquid phase epitaxy, both p-type with Ge and n-type with Sn, and in growth at this composition multiple p-n junctions tend to form. To enhance this behavior, both p-type (0.1 atomic percent Ge) and n-type (0.4 atomic percent Sn) layers were grown and the cooling rate was increased to 0.4 degrees Celsius/minute which is double the normal cooling rate. This growth method produced excellent, reproducible current confinement with a multiplicity of p-n junctions formed in the second growth or regrowth step.

The composition of the melts was adjusted to grow $Al_{0.65}Ga_{0.35}As$ for the regrowth step. The sample was placed in the growth boat and at constant temperature (750 degrees Celsius) placed under the first melt. To achieve good wetting, the furnace temperature was raised 1 degree Celsius and held for 30 minutes. The resulting melt back, estimated at no more than about 0.2 $\mu$m, helps clean the etched surface and reduces non-radiative recombination at the mesa regrowth layer interfaces. After this melt back step, the furnace temperature was lowered 0.4 degrees Celsius per minute to grow a layer approximately 1 $\mu$m thick. This layer was doped with Sn, 0.4 atomic percent, so that if the mesa side were wetted and regrown up to the p-type upper cladding layer in the mesa, current flow would be better inhibited by the p-n heterojunction thus formed than by a p-p heterojunction. The sample was next slid under the second melt, p-type, 0.1 atomic percent Ge, and after growth of about 2 μm, another n-type (0.4 atomic percent Sn) layer approximately 2 μm thick was grown. It has been found advantageous to use the approximate composition $Al_{0.65}Ga_{0.35}As$ to initiate the regrowth step, even if the burying layer is not to have this approximate composition, because of the good wetting characteristics of this composition.

The sample was then cleaned of surface Ga droplets by successive anodizations where the Ga is converted to oxides which are easily wiped from the surface. It is readily apparent that after the initial anodization, the native oxide only forms on the mesa tops and little native oxide is grown between the mesas due to the high resistance path formed by the regrowth.

Since the only vertical conductive path through the device is through the mesa, this conductive path can be usefully employed in forming arrays of isolated and individually contactable lasers. The laser to laser spacing is determined by the spacing of the stripes in the etching mask used to form the mesas. When the 12 μm wide stripe mask previously described is used, the laser to laser spacing could be as small as 15 μm, as the 3 μm unmasked space between masked stripes is sufficient to perform the mesa etching.

The device is then subjected to a brief Zn diffusion to form a p+ diffused layer approximately 0.3 μm thick. Metallization consisted of 100 Angstroms Ti (layer 15) and 2000 Angstroms Au (layer 17) on the p-side and 300 Angstroms Sn, 500 Angstroms Au, and 1000 Angstroms of Ni (layer 25) on the n-side. Using the same photolithographic techniques as were used in the mesa etching, windows in the gold on the p-surface, 10-25 μm wide, were etched to permit observation of the active layer luminescence. The metallizations were alloyed to form ohmic contacts by heating briefly to 510 degrees Celsius and lasers were formed by conventional cleaving.

The dopants used in the laser structure are at concentrations of $3 \times 10^{17}/cm^3$. The nominal layer thicknesses are: active layer 0.15 μm, waveguide layers 0.5 μm and upper and lower cladding layers 1.5 μm. The laser shown in FIG. 1 may be modified by omitting the waveguide layers or having only a single guiding layer. Other embodiments may also be constructed. For example, the active layer may comprise InGaAsP and the cladding and waveguiding layers may comprise InP. Additionally, layer 110 may have only a single conductivity type.

Typical current thresholds were 7 mA/μm for the lasers without waveguiding layers and 10 mA/μm for the lasers with the waveguiding layers.

The light versus current relationship for the loss stabilized buried optical guide lasers were very close to linear and had differential quantum efficiencies of approximately 50 to 60 percent. The light versus current relationships for the loss stabilized buried heterostructure lasers were slightly sublinear and had differential quantum efficiencies of approximately 25-35 percent. This fact makes the buried optical guide lasers generally superior to the buried heterostructure lasers.

The temperature dependence of the threshold current could be fitted approximately as $I_{th}$ approximately equal to $exp(T/T_0)$ where $T_0=167$ degrees K in the low temperature region in which T is less than 325 degrees K and $T_0=57$ degrees K in the high temperature region where T is greater than 350 degrees K. Data for loss stabilized buried heterostructure lasers were similar. The precise cause for the abrupt change in $T_0$ is not completely understood but it is hypothesized that it is due to increased current conduction around the active stripe. It was noted that the increase in current with temperature occurs at temperatures that are higher than that at which most lasers are expected to operate.

The loss stabilized laser is operated either in a single transverse mode with either 1 longitudinal mode or in a few closely spaced longitudinal modes. However, at high currents, generally more than 2.5 $I_{th}$, the spectra would sometimes broaden and occasionally a second set of modes would appear. In one case where $I_{th}$ was approximately 22 mA and a second set of modes appeared at approximately 70 mA, the far field pattern was measured through a spectrometer and the laser lines were identified as associated with the lowest and first excited transverse mode, i.e., $TE_{00}$ and $TE_{01}$ with the $TE_{01}$ mode occurring at the higher current. The measured full angles at half intensity were 21 degrees and 48 degrees. The energy of the $TE_{01}$ mode is 35 $cm^{-1}$ higher in photon energy than the $TE_{00}$ mode. This is evidence that the loss of the $TE_{01}$ mode, when the current is above the threshold of 70 mA for the $TE_{01}$ mode, is greater than that of the $TE_{00}$ mode. Lasing activity takes place at a value of $h\nu$ where the gain curve is a maximum. As the gain increases due to increased carrier density, the maximum of the gain curve shifts to higher energies.

The large index discontinuity between layer 110 and the layers forming the central mesa, at least 4 percent, together with the roughness of the etched mesa walls causes losses when interface scattering couples light from the initial mode into other modes. The losses, as will be apparent from the discussion of FIG. 2, increase rapidly with mode number and, it is hypothesized, provide a selection mechanism which causes the laser to operate in the lowest mode. That this hypothesis is plausible and valid may be understood from the following argument.

The scattering loss coefficients were calculated theoretically according to the detailed theory of interface scattering given by D. Marcuse in the Bell System Technical Journal, 48,pp. 3187-3215, Dec., 1969. The scattering loss formula was used to calculate scattering losses for the lowest as well as higher order modes. In FIG. 2, the scattering loss is plotted vertically in units of reciprocal centimeters and the stripe width in units of μm is plotted horizontally. The curves indicated as 1, 2, 3, 4, and 5 represent the $TE_{00}$, 01, 02, 03 and 04 modes, respectively. The mean square amplitude of the width fluctuations, defined as A, was 0.1μm and the coherence length of the fluctuations was 10 μm. These values are based on approximate measurements of etched mesas. Layer 110 had composition of $Al_{0.65}Ga_{0.35}As$ and the effective composition of the central mesa was $Al_{0.12}Ga_{0.88}As$. In this case, the refractive index discontinuity is approximately 10 percent. The calculated differences between the threshold currents for the second mode and the first mode are indicated on curve 2 for different stripe widths, W. It should be noted that for narrow widths, for example, 2.5 μm, that the difference in scattering loss for the lowest and first modes is considerable and that the difference between the threshold current for the second mode and the first mode is also considerable. In the case illustrated, i.e., a guide with many discrete modes, over 90 percent of the scattering loss was the result of coupling of light into bound modes with the remaining losses going into the continuum. Thus, as shown by FIG. 2 the loss increases both with increasing mode number and decreasing stripe width, W.

FIG. 3 plots the scattering loss vertically in units of reciprocal centimeters versus the refractive index discontinuity between $x_{eff}$ for the mesa and layer 110 expressed as a percentage of Al concentration in layer 110, $x_d$, minus 12 percent for the effective Al concentration in the mesa. The losses for the two lowest transverse modes, $TE_{00}$ and $TE_{01}$, are shown. The curves are for a W of 3 $\mu$m and A and the coherence length are the same, 0.1 $\mu$m and 10 $\mu$m, respectively, as for FIG. 2. Thus, it can be seen that for $\Delta x = x_d - x_{eff}$, i.e., $x_d - 12$ percent, greater than or equal to 4 percent, the index discontinuity is large and there is substantial mode selection due to the differences in scattering loss. In contrast, the regime of conventional buried heterostructure lasers has $\Delta x$ less than or equal to approximately 4 percent. With $\Delta x$ greater than approximately 4 percent, interface scattering can be appreciable and aid single mode stability of conventional buried heterostructure lasers.

The values of A and the coherence length were chosen on the basis of microscopic visual observations of the etched mesas. The loss curves in FIGS. 2 and 3 are proportional to $A^2$ and can be scaled for other choices of this parameter. If width fluctuations increase, the difference in scattering loss between modes will increase. However, the loss of the lowest mode will also increase and may reach undesirable levels. The optimum value of A will also depend on the lasing wavelength. The scattering loss decreases as the inverse fourth power of the wavelength and at wavelengths of, e.g., 1.3 $\mu$m, larger fluctuations may be desirable or the active layer width may be decreased.

As the laser current increases above threshold, laser operation begins in the lowest $TE_{00}$ mode. This mode has a slightly higher occupation of the active layer than other modes have and, more importantly, the lowest loss. At threshold, the carrier density is uniform in the active layer but as the current is increased above threshold and stimulated emission becomes intense, the carrier density at the center of the guide decreases and, to maintain the constant gain at the lowest mode, the carrier density near the stripe edges will increase. This change in carrier density, commonly referred to as spacial hole burning, will increase the gain at the $TE_{01}$ mode which eventually begins to lase. The optimum width, in terms of maximizing the difference in loss between the first and lowest order modes, is approximately 2 $\mu$m to approximately 3 $\mu$m. The width should not exceed approximately 4 $\mu$m. This range does not increase losses to the level where properties of the lowest mode are substantially degraded. For wide stripe lasers, i.e., W greater than 4 $\mu$m, loss stabilization is weak and other effects such as a nonuniform carrier density and crystal defects determine the lasing mode of threshold.

What is claimed is:

1. In a laser, a light emitting structure comprising an active layer, first and second semiconductor layers on opposing sides of said active layer, said active, first and second layers forming a mesa, said active layer having a width between approximately 2.0 $\mu$m and approximately 4.0 $\mu$m, a third semiconductor layer contacting opposite side faces of said active and first and second semiconductor layers, said active layer having a bandgap less than the bandgaps of said first and second semiconductor layers, and said third semiconductor layer having an index of refraction less than the effective index of the mesa by at least approximately 4 percent.

2. A structure as recited in claim 1 further comprising first and second guiding layers intermediate said active layer and said first semiconductor layer and said active layer and said second semiconductor layer, respectively.

3. A structure recited in claim 1 in which said layers comprise semiconductors selected from the group consisting of Group III-V elements.

4. A structure as recited in claim 3 in which said semiconductor comprises $Al_xGa_{1-x}As$, x of said third layer being greater than $x_{eff}$ of said mesa by at least approximately 20 percent.

5. A structure as recited in claim 4 in which said active layer has a width of between approximately 2.0 $\mu$m and 3.0 $\mu$m.

6. A structure as recited in claim 5 in which said x for said third layer is approximately 0.65.

7. A structure as recited in claim 6 in which said x for said first layer is approximately 0.30.

8. A laser superstructure comprising a first input emitting structure as recited in claim 1 and a second light emitting structure as recited in claim 1, said first and said second structures being disposed on a substrate and isolated from each other.

9. A superstructure as recited in claim 8 in which said first structure and said second structure are spaced from each other by approximately 15 $\mu$m.

10. A structure as recited in claim 3 in which said semiconductors comprise InGaAsP.

* * * * *